United States Patent
Matsumoto

(10) Patent No.: US 9,396,978 B2
(45) Date of Patent: Jul. 19, 2016

(54) SUBSTRATE PROCESSING APPARATUS, SUBSTRATE PROCESSING METHOD AND STORAGE MEDIUM

(75) Inventor: Takeshi Matsumoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 757 days.

(21) Appl. No.: 13/450,590

(22) Filed: Apr. 19, 2012

(65) Prior Publication Data

US 2012/0271444 A1 Oct. 25, 2012

(30) Foreign Application Priority Data

Apr. 20, 2011 (JP) ................................ 2011-094015
Feb. 24, 2012 (JP) ................................ 2012-038947

(51) Int. Cl.
G06F 19/00 (2011.01)
G06F 7/00 (2006.01)
H01L 21/67 (2006.01)

(52) U.S. Cl.
CPC .............................. H01L 21/67276 (2013.01)

(58) Field of Classification Search
CPC ............................................. H01L 21/67276
USPC ....................................................... 700/100
See application file for complete search history.

(56) References Cited

U.S. PATENT DOCUMENTS

| 6,618,682 B2 * | 9/2003 | Bulaga et al. .................... 702/84 |
| 2002/0133260 A1 * | 9/2002 | Nishihata et al. ............. 700/121 |
| 2006/0181699 A1 * | 8/2006 | Numakura ................. 356/237.2 |
| 2008/0019809 A1 * | 1/2008 | Takano .................... 414/222.01 |
| 2009/0097950 A1 * | 4/2009 | Tanaka ............. H01L 21/67276 414/222.13 |
| 2010/0021621 A1 * | 1/2010 | Hayashida ........ H01L 21/67178 427/8 |
| 2011/0218659 A1 * | 9/2011 | Nomura ......................... 700/96 |

FOREIGN PATENT DOCUMENTS

| JP | 2001-093791 A | 4/2001 |
| JP | 2011-009342 A | 1/2011 |

* cited by examiner

*Primary Examiner* — Mohammad Ali
*Assistant Examiner* — Yuhui R Pan
(74) *Attorney, Agent, or Firm* — Pearne & Gordon LLP

(57) ABSTRACT

A substrate processing apparatus can efficiently perform a trial operation in conditions close to those of an actual operation. In the substrate processing apparatus 1 for taking substrates W out of a transfer chamber (FOUPs 1 to 4), processing the substrates W in each of processing modules 2 and returning the processed substrates W to the transfer chamber, a mode selection unit 31 selects an operation check mode for performing an operation check of wafer transfer devices 15 and 17 or the processing modules 2. Further, a job setting unit 32 sets control jobs for the operation check and a process job as a recipe executed on the substrate W. A controller 3 determines whether or not a first control job and a second control job to be executed subsequently after the first control job are allowed to be executed in parallel.

15 Claims, 10 Drawing Sheets (a)

NUMBER OF TIMES OF EXECUTION

| | CONTROL JOB ID | TIME | | | | | | | | | |
|---|---|---|---|---|---|---|---|---|---|---|---|
| 1 | CJ1-001 | O | → | ● | | | | | | | |
| 2 | CJ2-002 | O | --- | → | ● | | | | | | |
| 3 | CJ1-003 | | | O | → | ● | | | | | |
| 4 | CJ2-004 | | | | O | → | ● | | | | |
| 5 | CJ1-005 | | | | | O | → | ● | | | |
| 6 | CJ2-006 | | | | | | O | → | ● | | |
| 7 | CJ1-007 | | | | | | | O | → | ● | |
| 8 | CJ2-008 | | | | | | | | O | → | ● |

○ CJ CREATION
● CJ DESTRUCTION
--- APPARATUS RESOURCE ON STANDBY
→ PROCESS BEING EXECUTED

FIG. 7

| | CJ1(1ST TIME) | CJ2(1ST TIME) | CJ3(1ST TIME) | CJ4(1ST TIME) | CJ1(2ST TIME) | CJ2(2ST TIME) | CJ3(2ST TIME) |
|---|---|---|---|---|---|---|---|
| | 001 | 002 | 003 | 004 | 005 | 006 | 007 |
| | PJ1-1 | PJ2-1 | PJ3-1 | PJ4-1 | PJ1-1 | PJ2-1 | PJ3-1 |
| | FOUP1 | | | | | | |
| | TRS1 | | | | | | |
| | SCR1 | | | | | | |
| | TRS2 | | | | | | |
| | FOUP1 | | | | | | |
| | | FOUP2 | | | | | |
| | | TRS3 | | | | | |
| | | SCR2 | | | | | |
| | | ↓ | | | | | |
| | | ↓ | | | | | |
| | | TRS4 | | | | | |
| | | FOUP2 | | | | | |
| | | | FOUP3 | | | | |
| | | | TRS5 | | | | |
| | | | SCR3 | | | | |
| | | | TRS6 | | | | |
| | | | FOUP3 | | | | |
| | | | | FOUP4 | | | |
| | | | | TRS7 | | | |
| | | | | SCR4 | | | |
| | | | | TRS8 | | | |
| | | | | FOUP4 | | | |
| | | | | | FOUP1 | | |
| | | | | | TRS1 | | |
| | | | | | SCR1 | | |
| | | | | | TRS2 | | |
| | | | | | FOUP1 | | |
| | | | | | | FOUP2 | |
| | | | | | | TRS3 | |
| | | | | | | SCR2 | |
| | | | | | | ↓ | |
| | | | | | | ↓ | |
| | | | | | | TRS4 | |
| | | | | | | FOUP2 | |
| | | | | | | | FOUP3 |
| | | | | | | | TRS5 |
| | | | | | | | SCR3 |
| | | | | | | | TRS6 |
| | | | | | | | FOUP3 |

TIME ↓

FIG. 8

| NUMBER OF TIMES OF AGING | CONTROL JOB ID | TIME | | | | | | | | |
|---|---|---|---|---|---|---|---|---|---|---|
| 1 | CJ1-001 | ○ | → | ● | | | | | | |
| 2 | CJ2-002 | ○ | --- | → | ● | | | | | |
| 3 | CJ3-003 | ○ | --- | --- | → | ● | | | | |
| 4 | CJ4-004 | ○ | --- | --- | --- | → | ● | | | |
| 5 | CJ1-005 | | | | | | ○ | → | ● | |
| 6 | CJ2-006 | | | | | | | ○ | → | ● |
| 7 | CJ3-007 | | | | | | | | ○ | → | ● |

○ CJ CREATION
● CJ DESTRUCTION
--- APPARATUS RESOURCE ON STANDBY
→ PROCESS BEING EXECUTED

FIG. 9

| | CJ1(1ST TIME) | CJ2(1ST TIME) | CJ2(2ST TIME) | CJ1(2ST TIME) | CJ2(3ST TIME) | CJ2(4ST TIME) | |
|---|---|---|---|---|---|---|---|
| | 001 | 002 | 003 | 004 | 005 | 006 | --- |
| | | | | | | | --- |
| | PJ1-1 | PJ2-1 | PJ2-1 | PJ1-1 | PJ2-1 | PJ2-1 | --- |
| | FOUP1 | FOUP2 | | | | | |
| | TRS1 | | | | | | |
| | SCR1 | TRS2 | | | | | |
| TIME ↓ | ↓ | SCR2 | | | | | |
| | ↓ | TRS4 | | | | | |
| | ↓ | FOUP2 | | | | | |
| | TRS3 | | FOUP2 | | | | |
| | FOUP1 | | TRS2 | | | | |
| | | | SCR2 | FOUP1 | | | |
| | | | TRS4 | | | | |
| | | | FOUP2 | TRS1 | | | |
| | | | | SCR1 | FOUP2 | | |
| | | | | ↓ | TRS2 | | |
| | | | | ↓ | SCR2 | | |
| | | | | ↓ | TRS4 | | |
| | | | | TRS3 | FOUP2 | | |
| | | | | FOUP1 | | FOUP2 | |
| | | | | | | TRS2 | --- |
| | | | | | | SCR2 | --- |
| | | | | | | TRS4 | --- |
| | | | | | | FOUP2 | --- |
| | | | | | | | --- |

SUBSTRATE PROCESSING APPARATUS, SUBSTRATE PROCESSING METHOD AND STORAGE MEDIUM

CROSS-REFERENCE TO RELATED APPLICATION

This application claims the benefit of Japanese Patent Application Nos. 2011-094015 and 2012-038947 filed on Apr. 20, 2011 and Feb. 24, 2012, respectively, the entire disclosures of which are incorporated herein by reference.

FIELD OF THE INVENTION

The present disclosure relates to a technique of checking an operation of a substrate processing apparatus configured to perform a process according to a preset recipe.

BACKGROUND OF THE INVENTION

A semiconductor processing apparatus includes a single-substrate processing apparatus. In the single-substrate processing apparatus, a FOUP (Front-Opening Unified Pod) is mounted on a mounting table and a multiple number of processing modules perform sequential processes or parallel processes on a substrate taken out of the FOUP. As one of this kind of substrate processing apparatuses, there is a substrate cleaning apparatus for cleaning a substrate. The substrate cleaning apparatus includes a mounting table configured to mount thereon a multiple number of FOUPs; a cleaning module configured to perform a cleaning process on a target surface of a rotating substrate by supplying a cleaning liquid and a scrub cleaning process on the target surface by touching a scrubber, such as a brush; and a transfer system configured to transfer the substrate between a processing module and the FOUP.

If a process is performed on the substrate, a transfer schedule of the substrate is created based on an assigned sequence of a process recipe set for the substrate (hereinafter, a process recipe to be executed based on a setting for the substrate will be referred to as "process job (PJ)") and a control job (CJ), as a group unit of PJs, set for a FOUP. The substrate is unloaded from the FOUP based on the transfer schedule and transferred to a preset processing module. Then, the processed substrate is returned to the FOUP.

Before an actual operation (a process on a product substrate) of the substrate cleaning apparatus is first started or when a maintenance process is performed, there is a request for a trial operation (also called "aging") in order to actually transfer the substrate or process the substrate within the processing module and check an operation of the substrate cleaning apparatus.

In this regard, by way of example, Patent Document 1 describes a technique of operating a substrate processing apparatus. The substrate processing apparatus is connected to a multiple number of process modules (PM) for performing a plasma process such as a dry etching process around a transfer module configured to transfer a substrate in a vacuum state. According to Patent Document 1, during an actual operation, if a CJ first activated in a preset PM does not contain a PJ executable in the PM, a PJ executable in the PM and belonging to another CJ is first allowed to be executed. Thus, whenever a PJ is executed, a great change of an atmosphere within the PM can be prevented. However, Patent Document 1 does not describe a method of efficiently performing a trial operation in conditions close to those of an actual operation.

Patent Document 1: Japanese Patent Laid-open Publication No. 2011-009342

BRIEF SUMMARY OF THE INVENTION

The illustrative embodiments provide a substrate processing apparatus capable of efficiently performing a trial operation in conditions close to those of an actual operation, a substrate processing method, and a storage medium that stores this method.

In view of the foregoing, there is provided a substrate processing apparatus for performing a process on a multiple number of substrates. The substrate processing apparatus includes a mounting table configured to mount thereon a transfer chamber for accommodating therein a multiple number of substrates; a multiple number of processing modules configured to perform processes on the substrates; a substrate transfer device configured to transfer the substrates between the mounting table and the processing modules; a mode selection unit configured to select an operation check mode for performing an operation check of, at least, the substrate transfer device or the processing modules; a job setting unit configured to set a multiple number of control jobs for performing the operation check and a process job, the process job being set by inputting, to each of the control jobs, a recipe executed on the substrate specified by the transfer chamber and a slot position of the transfer chamber; and a controller configured to determine whether or not a first recipe contained in a first control job and a second recipe contained in a second control job to be executed subsequently after the first control job are allowed to be executed in parallel.

The substrate processing apparatus may include the following features:

(a) The controller is configured to execute the first control job and the second control job in parallel, if the first recipe contained in the first control job and the second recipe contained in the second control job to be executed subsequently after the first control job are allowed to be executed in parallel.

(b) The controller may be configured to execute, if the second recipe is not allowed to be executed in parallel with the first recipe, the second control job after a substrate lastly executed by the first control job is accommodated in the transfer chamber.

(c) The substrate processing apparatus further may include a number setting unit configured to set the number of times of executing the control jobs for performing the operation check.

(d) The controller may be configured to cyclically execute the multiple number of control jobs a preset number of times in a preset sequence without changing the transfer chamber.

(e) The controller may be configured to change the number of times of execution set by the number setting unit during execution of the operation check.

(f) The job setting unit may be configured to set a multiple number of process jobs for each of the control jobs.

(g) The controller may be configured to determine whether or not the first control job and the second control job are allowed to be executed in parallel depending on whether or not transfer routes on recipes are overlapped.

(h) The controller may be configured to stop the operation check during the execution of the operation check.

(i) The controller may be configured to add a control job for an actual operation for performing a product substrate during the execution of the control job for performing the operation check.

In accordance with the illustrative embodiments, the controller determines whether or not a recipe contained in the control job to be subsequently executed among a multiple number of control jobs set for performing operation check can be executed in parallel with the present recipe. If the recipes can be executed in parallel, since these recipes are executed in parallel, checking operations is performed in a short time as compared to a case where the control jobs are executed individually. Therefore, it is possible to perform a trial operation with efficiency.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 6 is a time chart showing creation operations and destruction operations of CJs in accordance with the first illustrative embodiment;

FIG. 7 is a time chart showing execution operations of PJs in accordance with a second illustrative embodiment of an operation check mode;

FIG. 8 is a time chart showing creation operations and destruction operations of CJs in accordance with the second illustrative embodiment;

FIG. 9 is a time chart showing execution operations of PJs in accordance with a third illustrative embodiment of an operation check mode.

DETAILED DESCRIPTION OF THE INVENTION

Figure 1:
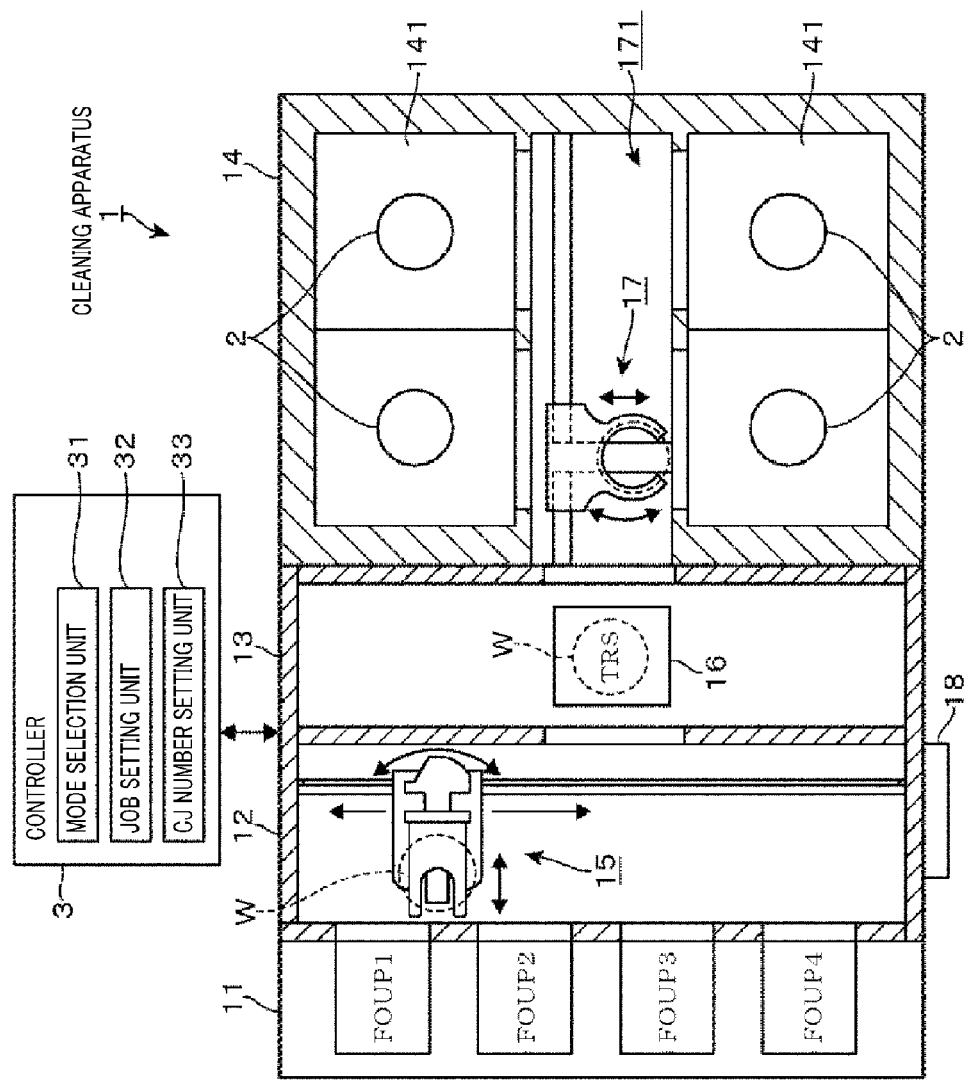
FIG. 1 is a plane view illustrating a schematic configuration of a cleaning apparatus in accordance with an illustrative embodiment.

Hereinafter, there will be explained an illustrative embodiment in which a substrate processing apparatus is applied to a cleaning apparatus. The cleaning apparatus includes a scrub cleaning module configured to touch a scrubber to a wafer W while supplying a cleaning liquid to the scrubber and configured to clean a target surface of the wafer W. As depicted in a transversal plane view of FIG. 1, a cleaning apparatus 1 includes a mounting block 11 configured to mount thereon FOUP1 to FOUP4, serving as transfer chambers, that accommodate a multiple number of wafers W; a loading/unloading block 12 configured to load and unload the wafers W taken out of the FOUP1 to FOUP4 mounted on the mounting block 11; a transfer block 13 configured to deliver the wafers W between the loading/unloading block 12 and a cleaning block 14 positioned at a rear end of the transfer block 13; and the cleaning block 14 configured to perform a scrub cleaning process on the wafer W. If a position of the mounting block is a front in line, the mounting block 11, the loading/unloading block 12, the transfer block 13, and the cleaning block 14 are arranged from the front in this order so as to be adjacent to one another. Further, an operation manipulation unit 18 including e.g. a touch panel type liquid crystal display is provided on an outer wall of the loading/unloading block 12.

The mounting block 11 mounts, on a mounting table, for example, four FOUPs (FOUP1 to FOUP4) accommodating the multiple number of wafers W in a horizontal state. The loading/unloading block 12 transfers the wafers W. The transfer block 13 delivers the wafers W. The loading/unloading block 12 and the transfer block 13 are accommodated in a housing.

The loading/unloading block 12 includes a first wafer transfer device 15. The first wafer transfer device 15 can be moved along a direction of arrangement of the FOUP1 to FOUP4. Further, in the first wafer transfer device 15, the transfer arm for holding the wafers W can be moved back and forth in a horizontal direction, can be rotated and also can be moved up and down in a vertical direction. The first wafer transfer device 15 transfers the wafers W between the FOUP1 to FOUP4 and the transfer block 13.

The transfer block 13 has a delivery shelf 16 capable of mounting, for example, eight wafers W thereon. Through the delivery shelf 16, the wafers W are delivered between the loading/unloading block 12 and transfer devices of the cleaning block 14 (the aforementioned first wafer transfer device 15 and a second wafer transfer device 17 to be described later).

The cleaning block 14 includes cleaning units 141 and a transfer unit 171. Each of cleaning units 141 accommodates a multiple number of cleaning modules 2, and the wafers W are transferred in the transfer unit 171. In the transfer unit 171, a second wafer transfer device 17 is provided in a space extended from a base end, i.e. a connected portion of the transfer unit 171 and the transfer block 13, in a forward and backward direction. The second wafer transfer device 17 can be moved along a direction of extension of the transfer unit 171. In the second wafer transfer device 17, the transfer arm for holding the wafers W can be moved back and forth in a horizontal direction, can be rotated and also can be moved up and down in a vertical direction. The second wafer transfer device 17 transfers the wafers W between the delivery shelf 16 and the respective cleaning modules 2.

As depicted in FIG. 1, in each of the cleaning units 141, a multiple number of, for example, two cleaning modules 2 are respectively provided at upper and lower stages along an extending direction of the transfer unit 171. Thus, total eight cleaning modules 2 are provided therein. Each of the cleaning modules 2 is configured to touch a scrubber such as a brush or a sponge to a target surface of the wafer W while supplying a cleaning liquid to the target surface and configured to clean the target surface. In each of the cleaning modules 2, various processes in different conditions such as a kind of a cleaning liquid and/or a cleaning region and cleaning time can be performed depending on a material of the wafers W and/or processes performed in other processing apparatuses before and after the cleaning process.

As depicted in FIG. 1, the cleaning apparatus 1 is connected to a controller 3. The controller 3 includes, for example, a computer having a CPU and a storage unit (both not illustrated). The storage unit stores a program formed of a step (command) group regarding the operations of the cleaning apparatus 1, i.e. a control of a process. In the process, the wafers W are taken out of the FOUP1 to FOUP4 mounted on the mounting block 11 and loaded into each of the cleaning modules 2. Then, a cleaning process is performed to the wafers W and the processed wafers W are returned to the FOUP1 to FOUP4. The program is stored in a storage medium such as a hard disk, a compact disk, a magnet optical disk, and a memory card. The program is installed in the computer by the storage medium.

Particularly, the controller 3 provided in the cleaning apparatus 1 is capable of switching between a processing mode and an operation check mode. In the processing mode, a cleaning process is performed to the product wafer W. Meanwhile, in the operation check mode, operations of the first and second wafer transfer devices 15 and 17 (substrate transfer devices) and/or the cleaning modules 2 (processing modules) are checked. Hereinafter, a function of the controller 3 for executing the operation check mode will be explained in detail.

In order to execute the operation check mode, the controller 3 has functions of a mode selection unit 31, a job setting unit 32, and a CJ number setting unit 33.

The mode selection unit 31 receives an instruction from a user or an inspection manager through an operation manipulation unit 18 of the cleaning apparatus 1, and switches an operation mode of the cleaning apparatus 1 between the processing mode and the operation check mode.

The job setting unit 32 has (1) a function of setting a CJ executed in the operation check mode and (2) a function of setting a PJ executed in each CJ.

Regarding the function (1), by manipulating the operation manipulation unit 18 by the user, the operation check mode is selected in the mode selection unit 31. Then, by manipulating the operation manipulation unit 18 by the user, information of a CJ is set. To be specific, the job setting unit 32 automatically assigns to the CJ an ID as an individual number (or may receive an ID inputted from the user) and selects the FOUP1 to FOUP4 to which the CJ is executed by the user.

Setting a PJ as the function (2) is performed to the CJ set in the above. By way of example, the job setting unit 32 displays, on the operation manipulation unit 18, a receipt view for the PJ with an ID (this ID may also be inputted from the user) automatically assigned as the CJ is set. Then, the user sets a recipe to be executed to the wafer W within the FOUP1 to FOUP4 selected by using the display, and the job setting unit 32 receives the set recipe. The wafer W to which each PJ is executed is specified according to a slot position of the FOUP1 to FOUP4.

Figure 2:
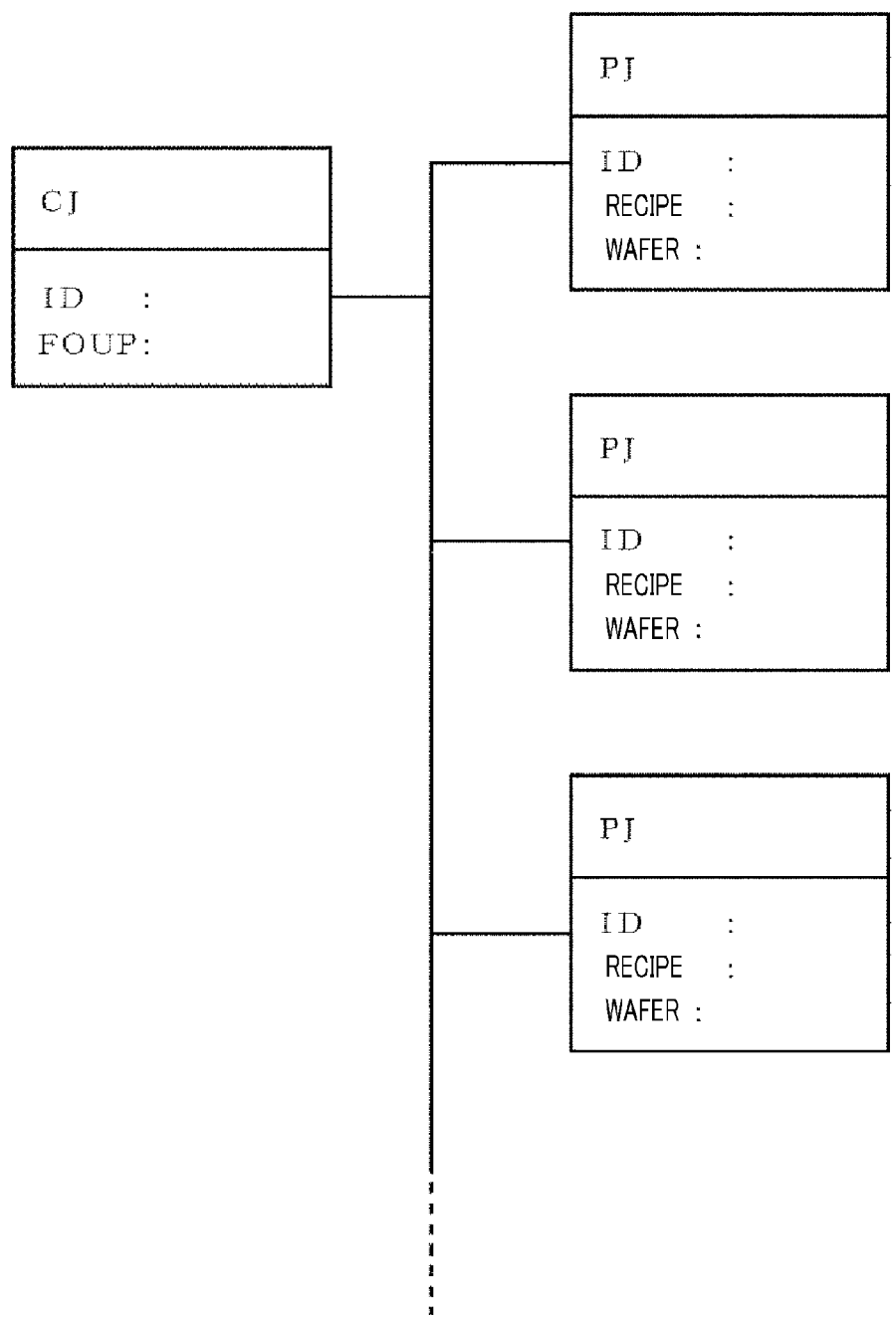
FIG. 2 is an explanatory diagram illustrating a setting screen example of a CJ and PJs in the cleaning apparatus.

A multiple number of PJs can be set for each CJ. To be specific, after the job setting unit 32 receives a setting of a PJ for a CJ, the user may select whether or not to set another different PJ for the CJ and may perform the same setting (setting of a recipe or setting of the wafer W) to a newly created PJ. When the PJ is newly set, the job setting unit 32 receives the newly set PJ. As a result, as depicted in FIG. 2, one or more PJs can be set for a CJ.

Figure 3:
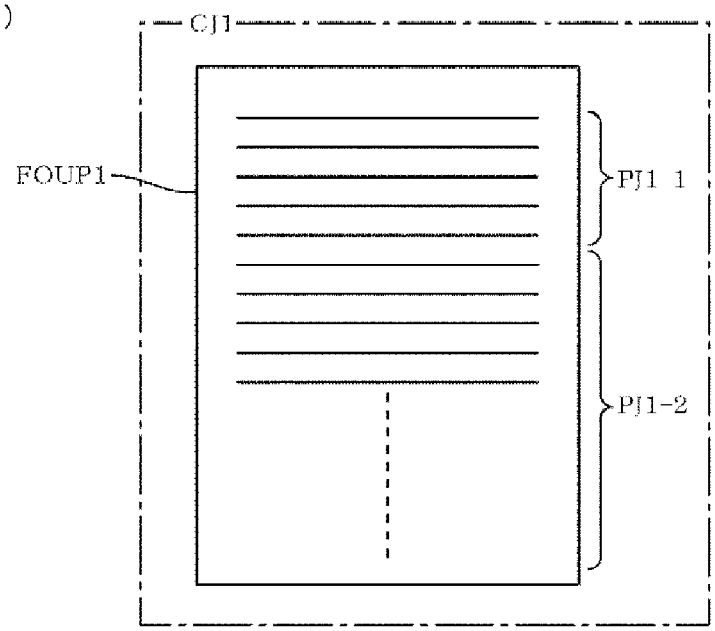
FIGS. 3(a) and 3(b) are explanatory diagrams each illustrating a setting example of a CJ and PJs.
Figure 3:
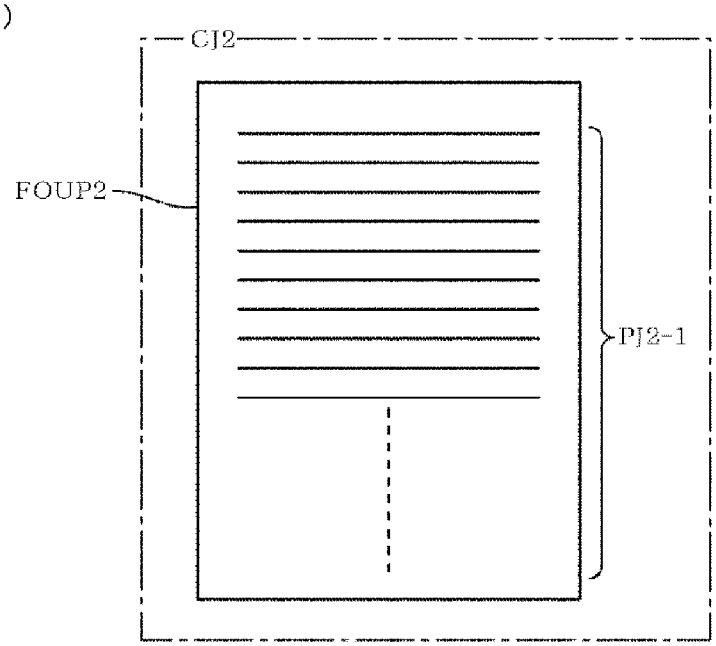

By way of example, FIG. 3(*a*) illustrates an example where "CJ1" containing two PJs, i.e. "PJ1-1" and "PJ1-2" is set for the single FOUP1, and FIG. 3(*b*) illustrates an example where "CJ2" containing a single "PJ2-1" is set for the single FOUP2.

In the operation check mode, various PJs can be set for a case where only a transfer operation is performed without performing a scrub cleaning process and/or a case where the wafers W are transferred while performing a scrub cleaning process. Here, the transfer operation includes taking the wafers W out of the FOUP1 to FOUP4; transferring the wafers W to each of the cleaning modules 2 according to a transfer schedule; and returning the wafers W to the FOUP1 to FOUP4.

There is a great difference between the processing mode and the operation check mode in dealing with the wafers W. In the processing mode, the FOUP1 to FOUP4 accommodating the product wafers W previously processed in a processing apparatus are mounted on the mounting table. The wafers W taken out of the FOUP1 to FOUP4 are processed in the cleaning module 2 and returned to the FOUP1 to FOUP4 to be accommodated therein. Then, the FOUP1 to FOUP4 are unloaded to a processing apparatus. In this way, new FOUP1 to FOUP4 are continuously transferred to the mounting table.

On the contrary, the operation check mode is executed in order to check operations of the first and second wafer transfer devices 15 and 17 and/or the cleaning modules 2. Thus, the same wafer W may be repeatedly taken out of the FOUP1 to FOUP4 on the mounting table without changing the FOUP1 to FOUP4, and a PJ may be executed to the same wafer W. Accordingly, the controller 3 of the present illustrative embodiment has a function of the CJ number setting unit 33 in addition to the functions of the mode selection unit 31 and/or the job setting unit 32. Thus, the controller 3 can set the number of times of execution of a CJ for the FOUP1 to FOUP4. As a result, by way of example, if the CJ is executed ten (10) times in total to the four FOUP1 to FOUP4 each accommodating twenty five (25) wafers (one hundred (100) wafers in total), the operation can be checked in the same conditions as a case where one thousand (1000) product wafers W are processed in the processing mode.

If the number of times of execution of the CJ is set by the CJ number setting unit 33, the controller 3 executes the CJ cyclically in a preset sequence. After the CJ is executed a preset number of times, the operation check mode is ended. In the present illustrative embodiment, the FOUP1 to FOUP4 are mounted on the mounting table in sequence from a left end of the mounting table and CJs set for the FOUP1 to FOUP4 in sequence are executed cyclically. Herein, "executed cyclically" means that a multiple number of times of processes are performed without unloading the FOUP accommodating a processed wafer W to the outside of the cleaning apparatus 1.

If PJs contained in the CJs to be executed in a successive sequence can be executed in parallel, the controller 3 executes the PJs in parallel. If the PJs cannot be executed in parallel, the PJs are executed in the above-described sequence. This function will be explained in detail below with reference to FIGS. 4 to 10.

Figure 4:
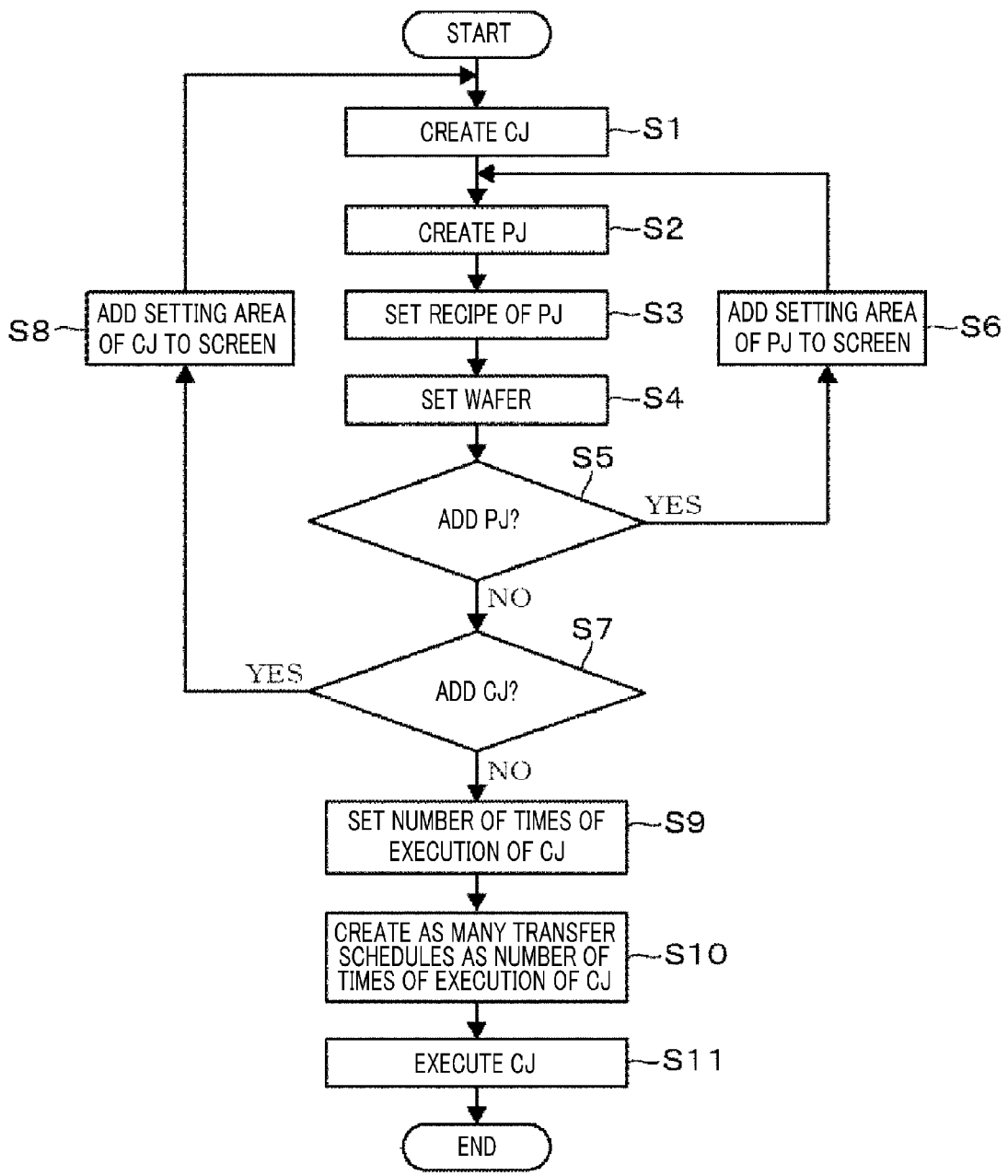
FIG. 4 is a flow chart showing a flow of operations of the cleaning apparatus.

Referring to FIG. 4, an operation of the cleaning apparatus 1 in the operation check mode will be explained. The user selects the operation check mode of the cleaning apparatus 1 by manipulating the operation manipulation unit (FIG. 4, start). Through manipulation of the user, a CJ is created. By receiving automatically assigned ID and/or selection of the FOUP1 to FOUP4, the job setting unit 32 sets the CJ (step S1). A PJ is created for the CJ and an ID is automatically assigned (step S2). Then, by receiving a setting on a recipe (step S3) and/or a setting on a wafer W (step S4) executed by the user, the job setting unit 32 sets the created PJ. Thereafter, a selection of whether or not to add a new PJ for the CJ is determined (step S5).

If another PJ is selected to be added by the user (step S5; YES), the job setting unit 32 adds a setting area of the PJ to a screen of the operation manipulation unit 18 (step S6). Further, by setting a recipe and/or a setting on a wafer W, the newly created PJ is set (steps S2 to S4). In this way, as many PJs as necessary can be added. If another PJ is not added (step S5; NO), a selection of whether or not to add a new CJ to the operation check mode is determined (step S7).

If another CJ is selected to be added by the user (step S7; YES), the job setting unit 32 adds a setting area of the CJ to the screen of the operation manipulation unit (step S8). Further, a setting operation of a recipe and/or a wafer W for each PJ is repeatedly performed, and the new CJ and the PJ are set (and an added PJ) (steps S1 to S6).

If as many CJs as necessary are added and no more CJs are added (step S; NO), the CJ number setting unit 33 sets the number of times of executing CJs (step S9). Then, based on contents of PJs set for each CJ and the number of times of executing the CJs, the controller 3 creates a transfer schedule of a wafer W in each of the FOUP1 to FOUP4 (step S10).

When the transfer schedule is created, the wafer W is taken out of each of the FOUP1 to FOUP4 and transferred to each of the processing modules 2 based on the transfer schedule. Then, a process for checking operation is performed according to a recipe of each PJ (step S11). Thereafter, when the CJs are executed a preset number of times, the cleaning apparatus 1 finishes the operation in the operation check mode (end).

Hereinafter, referring to FIGS. 5 and 6, there will be explained an operation example in the operation check mode when CJs cannot be executed in parallel. In the present illustrative embodiment, two FOUPs (FOUP1 and FOUP2) are mounted on the mounting table of the cleaning apparatus 1, and as depicted in FIG. 3, a CJ1 containing two PJs, a PJ1-1 and a PJ1-2, is set for the FOUP1, and CJ2 containing only a PJ2-1 is set for the FOUP2. Further, in the operation check mode, the CJ1 and the CJ2 are executed eight (8) times in total.

Figure 5:
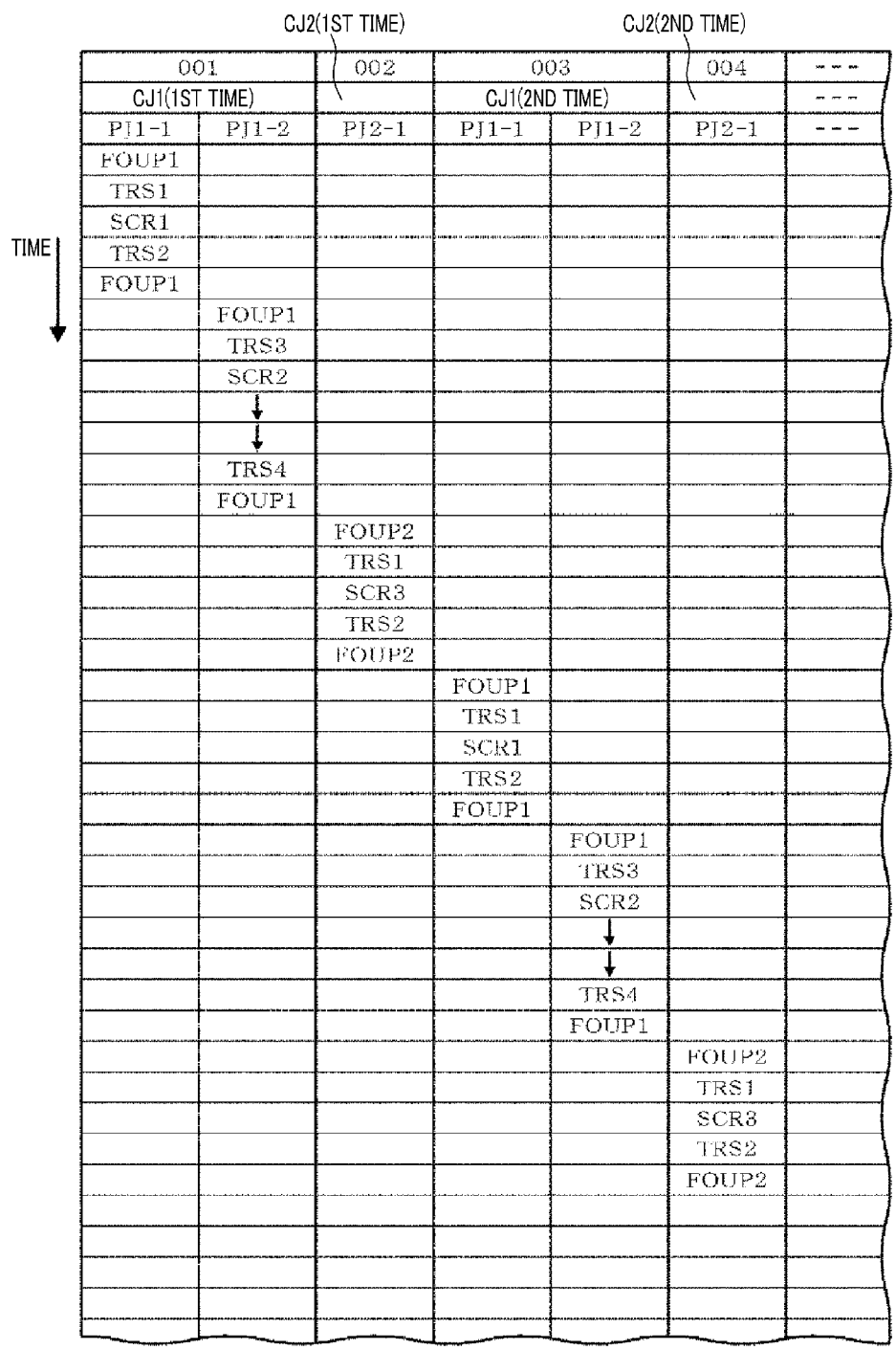
FIG. 5 is a time chart showing execution operations of PJs in accordance with a first illustrative embodiment of an operation check mode of the cleaning apparatus.

FIG. 5 is a time chart showing an execution schedule of each PJ and the time elapsed is indicated in a downward direction. In FIG. 5, a TRS1 and a TRS2 are slots of the delivery shelf 16 used for unloading from the FOUP1 and FOUP2 to the cleaning modules 2, a TRS3 and a TRS4 are slots of the delivery shelf 16 used for loading from the cleaning modules 2 to the FOUP1 and FOUP2, and SCR1 to SCR3 are the cleaning modules 2 used in each PJ. Each downward arrow represents that a process in the cleaning module 2 is in progress.

Positions of the slots (TRS1 to TRS4) of the delivery shelf 16 and/or the cleaning modules 2 (SCR1 to SCR3) used in each PJ are set when the controller creates a transfer schedule after CJs and PJs are set. The reference numerals assigned to the TRSs 1 to 4 and the SCRs 1 to 3 are management numbers on the transfer schedule. It is not necessary for each number to represent a different slot and/or a different cleaning module 2. In the operation check mode shown in FIG. 5, by way of example, if a processing liquid supplied to a scrubber of the cleaning module 2 needs to be changed and/or if transfer routes on a recipe are overlapped, the controller 3 cannot executes the PJ1-1 and PJ1-2 contained in the CJ1 and the PJ2-1 contained in the CJ2 in parallel. That is, the controller 3 cannot execute the CJ1 and the CJ2 in parallel.

Herein, "transfer routes on a recipe" means routes for transferring wafers W through other components such as the first and second wafer transfer devices 15 and 17 and/or each slot of the delivery shelf 16, and the cleaning modules 2. While a component on a transfer route set for a certain wafer W is occupied by the wafer W, another wafer W cannot be on the transfer route on which the component occupied by the certain wafer W is used. To be specific, while a wafer W is processed in the cleaning module 2 based on a certain PJ, another wafer W to which another PJ is set cannot be transferred to the cleaning module 2. Further, while a wafer W is mounted on a certain slot of the delivery shelf 16 based on a certain PJ, another wafer W to which another PJ is set cannot be mounted on the slot. In these cases, the controller 3 cannot execute the CJs containing the respective PJs in parallel.

As depicted in FIG. 5, the controller 3 executes CJs cyclically in a sequence of CJ1 (1st time)→CJ2 (1st time)→CJ1 (2nd time)→ . . . from a CJ set for a FOUP assigned with a smaller reference numeral between the FOUP1 and the FOUP2. Accordingly, PJs are executed in a sequence of PJ1-1→PJ1-2→PJ2-1→PJ1-1→ . . . .

The PJs are executed based on a schedule of FIG. 5. Thus, as depicted in a time chart of FIG. 6, by making a correspondence between each CJ and the number of times of execution thereof, the controller 3 creates and destroys CJs to be executed. In FIG. 6, open circles represent creation operations of the CJs to be executed and filled circles represent destruction operations thereof. Further, a dotted line represents a standby state of an apparatus resource, and an arrow to the right represents an execution of a transfer or a process of a wafer W.

When the operation check mode is started, the controller 3 assigns signs corresponding to the number of times of execution of a CJ (for example, three-digit numbers with an increment of 1 are assigned) to an ID generated at the time of setting the CJ, and generates an ID of a CJ to be executed. In the present illustrative embodiment, the CJ1 set for the FOUP1 is first executed, and, thus, an ID of a first-executed CJ is "CJ1-001" and an ID of a subsequently-executed CJ is "CJ2-002".

Further, the controller 3 determines whether or not the CJ1-001 and CJ2-002 are allowed to be executed in parallel. In the present illustrative embodiment, the PJ2-1 set for the CJ2-002 cannot be executed in parallel with the PJ1-1 and PJ1-2 set for the CJ1-001. Therefore, regarding the CJ1-001, the controller 3 executes the processes of PJ1- and PJ1-2. Meanwhile, regarding the CJ2-002 containing the PJ2-1 that cannot be executed in parallel with the PJ1-1 and PJ1-2, an apparatus resource is in a standby state. Then, when the processes of the PJs contained in the CJ1-001 are finished, the PJ2-1 of the CJ2-002 is executed.

When the execution of CJ1-001 is finished, the controller 3 destroys the corresponding CJ and creates another CJ with an ID of "CJ1-003" to be cyclically executed after the CJ2-002 for the same FOUP. In this way, the controller 3 determines whether or not the CJ being executed and the newly created CJ are allowed to be executed in parallel when the CJ to be subsequently executed is newly created. In accordance with the present illustrative embodiment, when the CJ1-003 is created, the CJ2-002 not capable of being executed in parallel is being executed. Therefore, the execution of the CJ1-003 is not started. After the CJ2-002 is ended, the CJ1-003 can be executed.

As described above, the completely executed CJ is destroyed and the subsequently executed CJ is newly created. As a result, the FOUP1 and FOUP2 on the mounting table are treated virtually as being unloaded to the outside of the cleaning apparatus 1 and replaced. Further, a CJ can be executed a preset number of times for the same FOUP. In the example shown in FIG. 6, when a CJ2-008 corresponding to an eighth CJ is executed, the controller 3 finishes the operation check mode.

By way of example, FIGS. 7 and 8 show that when CJ1 to CJ4 are respectively set for the four FOUPs (FOUP1 to FOUP4) on the mounting table and single PJ containing PJ1-1 to PJ4-1 not capable of being executed in parallel is set in each CJ, the CJ1 to CJ4 are executed seven (7) times in total.

In this case, as depicted in FIG. 8, when the operation check mode is started, the controller 3 creates CJ1-001 to CJ1-004 and determines whether or not each of the CJs is allowed to be executed in parallel. Since the PJs not capable of being executed in parallel are set for each CJ, the CJs are executed such that the PJ1-1 to PJ4-1 are not executed in parallel. Further, the controller 3 cyclically creates CJs to be executed for the FOUP1 to FOUP4 in sequence from a FOUP assigned with a smaller reference numeral. When CJ3-007 as a seventh CJ is executed, the operation check mode is ended.

Hereinafter, there will be explained an operation example in the operation check mode when CJs can be executed in parallel. In the present illustrative embodiment, two FOUPs (FOUP1 and FOUP2) are mounted on the mounting table of the cleaning apparatus 1, and the CJ1 containing the PJ1-1 is set for the FOUP1, and CJ2 containing the PJ2-1 is set for the FOUP2. Further, in the operation check mode, the CJ1 and CJ2 are executed six (6) times in total.

In the operation check mode in the present illustrative embodiment, by way of example, if a processing liquid supplied to a scrubber of the cleaning module 2 is shared or if transfer routes on a recipe are not overlapped, the PJ1-1 and PJ2-2 contained in each CJ can be executed in parallel. That is, the controller 3 may execute the CJ1 and the CJ2 in parallel. An execution time of the PJ1-1 is longer than an execution time of the PJ2-1.

In this case, as depicted in FIG. 9, the controller 3 executes the CJ1 (1st time) in parallel with the CJ2 (1st time). Further, the CJ2 (1st time) having a shorter execution time is first ended and a subsequent CJ is created. At this time, since the CJ1 (1st time) for the FOUP1 is being executed, execution start of the CJ1 (2nd time) is overtaken by execution start of the CJ2 (2nd time) for the FOUP 2. Then, when the CJ1 (1st time) is ended, execution of the CJ2 is started after the CJ1 based on a preset sequence. At this time, the CJ2 (2nd time) is being executed, and, thus, the controller 3 executes CJ1 (2nd time) for the FOUP1 before the CJ2 (3rd time) is started to be executed.

The PJs are executed based on a schedule of FIG. 9. Thus, as depicted in a time chart of FIG. 10, by making a correspondence between each CJ and the number of times of execution thereof, CJs to be executed are created and destroyed. When the operation check mode is started, the controller 3 assigns a sign corresponding to the number of times of execution of a CJ to an ID generated at the time of setting the CJ and generates IDs, such as "CJ1-001" and "CJ2-002" of CJs to be executed.

Since a PJ1-1 and a PJ2-1 contained in the CJ1-001 and the CJ2-002, respectively, can be executed in parallel, the controller 3 executes these CJs in parallel and the CJ2-002 having a shorter execution time is first ended. Regarding the ended CJ2-002, the corresponding CJ is destroyed. Another CJ to be subsequently executed with an ID of "CJ2-003" is created for the same FOUP2.

Figure 10:
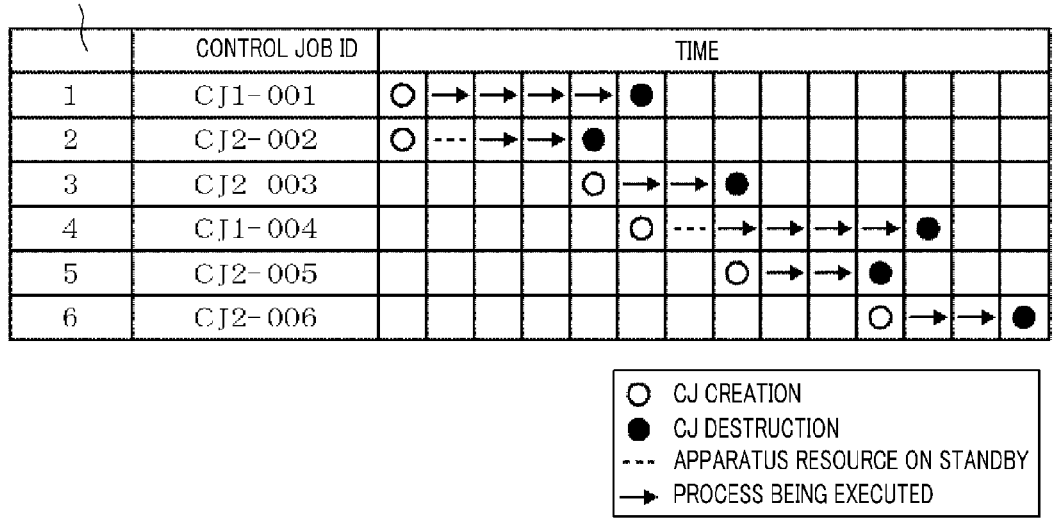
FIG. 10 is a time chart showing creation operations and destruction operations of CJs in accordance with the third illustrative embodiment.

When execution of the newly created CJ2-003 can be started, the controller 3 determines whether or not the CJ2-003 can be executed in parallel with the CJ1-001 being executed. In the present illustrative embodiment, the CJ2-003 can be executed in parallel with the CJ1-001, and, thus, CJ2-003 and the CJ1-001 are executed in parallel. When the CJ1-001 is ended, the corresponding CJ is destroyed. Another CJ to be subsequently executed with an ID of "CJ1-004" is created for the same FOUP1. In this way, as depicted in FIG. 10, CJ1-001 to CJ2-006 are created, and when execution of a CJ1-006 is ended lastly, the operation check mode is finished.

The cleaning apparatus 1 in accordance with the present illustrative embodiment has the following effect. The controller 3 determines whether PJs contained in successive CJs among a multiple number of CJs set for checking operations can be executed in parallel or not. If the PJs can be executed in parallel, since these PJs are executed in parallel, operations can be checked in a short time as compared to a case where the CJs are executed individually. Therefore, it is possible to perform a trial operation with efficiency. Further, the PJs are executed in a preset sequence and substrates are repeatedly taken out of the same FOUP and the CJs are cyclically executed thereto. Accordingly, it is possible to create the same transfer schedule as that of an actual operation without changing a FOUP, and, thus, it is possible to efficiently perform a trial operation close to an actual operation.

Further, since the number of times of execution of a CJ in an operation check mode can be set in advance, as many CJs as necessary for an operation check (the number of processed wafers W and/or a time for the operation check) can be executed. Thus, an operation in the operation check mode can be stopped automatically and there is no need to non-automatically stop the operation by a user. Herein, the number of times of execution of a CJ set by the CJ number setting unit 33 may be changed in response to an instruction of the user via the operation manipulation unit 18.

The CJ for an operation check is executed the number of times set by the CJ number setting unit 33 and may be stopped on the way in response to an instruction of the user via the operation manipulation unit 18 and/or any errors detected from components (the first and second wafer transfer devices 15 and 17 or the cleaning modules 2) on a transfer route. In this case, the CJ may be stopped by ending the operation check or the CJ may be interrupted to be resumed. When a certain CJ is stopped or interrupted, another CJ may be continuously executed. When a certain PJ contained in a CJ is stopped or interrupted, another PJ may be continuously executed. Further, when a CJ for a certain FOUP is stopped or interrupted, the CJ for another FOUP may be continuously executed.

While a CJ is executed in an operation check (operation check mode), a CJ for processing a product wafer W in an actual operation (processing mode) may be executed during the execution of a CJ in the operation check mode. Even if a wafer W in need of an urgent actual process is supplied during the operation check, since the CJ of the actual operation can be executed during the operation check, the operation check is not stopped and can be executed in parallel with the actual process.

In the above-described illustrative embodiment, the CJs are set for the respective FOUP1 to FOUP4. However, a setting unit of the CJs is not limited thereto. By way of example, the CJs may be set for a multiple number of the FOUP1 to FOUP4 together. Further, a sequence of cyclic execution of the CJs is not limited to the sequence in which the FOUP1 to FOUP4 are mounted on the mounting table as described in the above-described illustrative embodiment. If a sequence of execution is set in advance, any sequence is allowable.

The substrate processing apparatus in accordance with the present illustrative embodiment is not limited to the cleaning apparatus that performs the scrub cleaning process. By way of example, the substrate processing apparatus may be applied to a single-substrate liquid processing apparatus including a liquid processing module that performs a liquid process by supplying a processing liquid to a substrate rotated on a vertical axis. Further, the substrate processing apparatus may be applied to a plasma processing apparatus, such as an etching apparatus and/or an asking apparatus, in which a multiple number of processing chambers as processing modules are connected to a common transfer device.

What is claimed is:

1. A substrate processing apparatus for performing a process on a plurality of substrates, the substrate processing apparatus comprising:
a mounting table configured to mount thereon a plurality of transfer chambers for accommodating therein a multiple number of substrates;

a plurality of processing modules configured to perform processes on the substrates;

a substrate transfer device configured to transfer the substrates between the mounting table and the processing modules;

a delivery shelf positioned between the mounting table and the processing modules, the delivery shelf including a first slot for unloading the substrates from the mounting table to the processing modules and a second slot for loading the substrates from the processing modules to the mounting table;

a mode selection unit configured to select an operation check mode for performing an operation check of, at least, the substrate transfer device or the processing modules;

a job setting unit configured to set a plurality of control jobs for performing the operation check and a process job, each of the plurality of control jobs being set for each of the plurality of transfer chambers, the process job being set by inputting, to each of the control jobs, a recipe executed on the substrate specified by each of the transfer chambers and a slot position of each of the transfer chambers, wherein executing one of the plurality of control jobs one time comprises processing all of the substrates in each of the plurality of transfer chambers for which the one of the control jobs is set;

a number setting unit configured to set the number of times of executing the control jobs for performing the operation check; and a controller configured to determine whether or not a first control job set for a first transfer chamber and a second control job set for a second transfer chamber are allowed to be executed in parallel, when the operation check mode is selected by the mode selection unit and the plurality of control jobs are executed, wherein the second control job executes a different recipe from the first control job, wherein the controller is configured to determine whether or not the first control job and the second control job are allowed to be executed in parallel depending on whether or not a transfer route of the first control job is overlapped with a transfer route of the second control job, the transfer route of the first control job includes routes for transferring the substrates through the substrate transfer device, the first slot and the second slot of the delivery shelf, and the processing modules, the transfer route of the second control job includes routes for transferring the substrates through the substrate transfer device, the first slot and the second slot of the delivery shelf, and the processing modules, and the controller is configured to execute each of the first control job and the second control job at least two times without changing the plurality of the transfer chambers when the operation check mode is selected.

2. The substrate processing apparatus of claim 1, wherein the controller is configured to execute the first control job and the second control job in parallel if the first control job and the second control job to be executed subsequently after the first control job are allowed to be executed in parallel.

3. The substrate processing apparatus of claim 1, wherein the controller is configured to execute, if the second control job is not allowed to be executed in parallel with the first control job, the second control job after a substrate lastly executed by the first control job is accommodated in the first transfer chamber.

4. The substrate processing apparatus of claim 1, wherein the controller is configured to change the number of times of execution set by the number setting unit during execution of the operation check.

5. The substrate processing apparatus of claim 1, wherein the job setting unit is configured to set a plurality of process jobs for each of the control jobs.

6. The substrate processing apparatus of claim 1, wherein the controller is configured to stop the operation check during the execution of the operation check.

7. The substrate processing apparatus of claim 1, wherein the controller is configured to add a control job for an actual operation for performing a product substrate during the execution of the control job for performing the operation check.

8. A substrate processing method for mounting a plurality of transfer chambers that accommodate a plurality of substrates on a mounting table; taking the substrates out of the plurality of transfer chamber by a substrate transfer device and transferring the substrates to any one of a plurality of processing modules to be processed via a first slot of a delivery shelf that is positioned between the mounting table and the plurality of processing modules; and returning the processed substrates to the plurality of transfer chambers via a second slot of the delivery shelf, the substrate processing method comprising:

selecting an operation check mode for performing an operation check of, at least, the substrate transfer device or the processing modules;

setting a plurality of control jobs for performing the operation check and a process job, each of the plurality of control jobs being set for each of the plurality of transfer chambers, the process job being set by inputting, to each of the control jobs, a recipe executed on the substrate specified by each of the transfer chambers and a slot position of each of the transfer chamber, wherein executing one of the plurality of control jobs one time comprises processing all of the substrates in each of the plurality of transfer chambers for which the one of the control jobs is set;

setting the number of times of executing the control job for performing the operation check; and determining, when the operation check mode is selected by a mode selection unit and the plurality of control jobs are executed, whether or not a first control job set for a first transfer chamber and a second control job set for a second transfer chamber are allowed to be executed in parallel, wherein the second control job executes a different recipe from the first control job, wherein whether or not the first control job and the second control job are allowed to be executed in parallel is determined depending on whether or not a transfer route of the first control job is overlapped with a transfer route of the second control job, the transfer route of the first control job includes routes for transferring the substrates through the substrate transfer device, the first slot and the second slot of the delivery shelf, and the processing modules, the transfer route of the second control job includes routes for transferring the substrates through the substrate transfer device, the first slot and the second slot of the delivery shelf, and the processing modules, and each of the first control job and the second control job is executed at least two times without changing the plurality of the transfer chambers when the operation check mode is selected.

9. The substrate processing method of claim 8, further comprising:
   executing, if the first control job and the second control job to be executed subsequently after the first control job are allowed to be executed in parallel, the first control job and the second control job in parallel.

10. The substrate processing method of claim 8, further comprising:
   executing the second control job after a substrate lastly executed by the first control job is accommodated in the transfer chamber, if the second control job is not allowed to be executed in parallel with the first control job.

11. The substrate processing method of claims 8, wherein the number of times of execution for the operation check is allowed to be changed during execution of the operation check.

12. The substrate processing method of claim 8, wherein a plurality of process jobs is set for each of the control job.

13. The substrate processing method of claim 8, wherein the operation check is allowed to be stopped during the execution of the operation check.

14. The substrate processing method of claim 8, wherein a control job for an actual operation for performing a product substrate is allowed to be added during the execution of the control job for performing the operation check.

15. A non-transitory computer-readable storage medium having stored thereon computer-executable instructions, in response to execution, cause a substrate processing apparatus to perform a substrate processing method, wherein the substrate processing method is for mounting a plurality of transfer chambers that accommodate a plurality of substrates on a mounting table;
   taking the substrates out of the plurality of transfer chamber by a substrate transfer device and
   transferring the substrates to any one of a plurality of processing modules to be processed via a first slot of a delivery shelf that is positioned between the mounting table and the plurality of processing modules;
   and returning the processed substrates to the plurality of transfer chambers via a second slot of the delivery shelf, the substrate processing method comprising:
   electing an operation check mode for performing an operation check of, at least, the substrate transfer device or the processing modules:
   setting a plurality of control jobs for performing the operation check and a process job, each of the plurality of control jobs being set for each of the plurality of transfer chambers, the process job being set by inputting, to each of the control jobs, a recipe executed on the substrate specified by each of the transfer chambers and a slot position of each of the transfer chamber, wherein executing one of the plurality of control jobs one time comprises processing all of the substrates in each of the plurality of transfer chambers for which the one of the control jobs is set:
   setting the number of times of executing the control job for performing the operation check; and
   determining, when the operation check mode is selected by a mode selection unit and the plurality of control jobs are executed, whether or not a first control job set for a first transfer chamber and
a second control set for a second transfer chamber are allowed to be executed in parallel, wherein the second control job executes a different recipe from the first control job,
   wherein whether or not the first control job and the second control job are allowed to be executed in parallel is determined depending on whether or not a transfer route of the first control job is overlapped with a transfer route of the second control job,
   the transfer route of the first control job includes routes tor transferring the substrates through the substrate transfer device, the first slot and the second slot of the delivery shelf, and the processing modules,
   the transfer route of the second control job includes routes for transferring the substrates through the substrate transfer device, the first slot and the second slot of the delivery shelf, and the processing modules, and
   each of the first control job and the second control job is executed at least two times without changing the plurality of the transfer chambers when the operation check mode is selected.

* * * * *